United States Patent
Patti et al.

(10) Patent No.: US 6,448,125 B1
(45) Date of Patent: Sep. 10, 2002

(54) ELECTRONIC POWER DEVICE INTEGRATED ON A SEMICONDUCTOR MATERIAL AND RELATED MANUFACTURING PROCESS

(75) Inventors: Davide Patti, Catania; Francesco Priolo, San Giovanni la Punta; Vittorio Privitera, Acicastello; Giorgia Franzo, San Giovanni la Punta, all of (IT)

(73) Assignee: STMicroelectronics S.r.l., Agrate Brianza (IT)

(*) Notice: Subject to any disclaimer, the term of this patent is extended or adjusted under 35 U.S.C. 154(b) by 0 days.

(21) Appl. No.: 09/238,693

(22) Filed: Jan. 27, 1999

(30) Foreign Application Priority Data

Jan. 30, 1998 (IT) .......................... MI98A0170

(51) Int. Cl.⁷ ......................................... H01L 21/8238
(52) U.S. Cl. ..................... 438/205; 438/235; 438/236; 438/313; 438/336; 438/341; 438/340
(58) Field of Search ............................... 438/234, 235, 438/236, 309, 341, 350, 353, 369, 336, 205, 313, 340; 257/565, 582

(56) References Cited

U.S. PATENT DOCUMENTS

| | | | |
|---|---|---|---|
| 3,473,090 A | * 10/1969 | Bohannon, Jr. | |
| 3,884,732 A | * 5/1975 | Baitlinger et al. | 148/175 |
| 3,970,487 A | * 7/1976 | Dahmen et al. | 148/187 |
| 4,054,899 A | * 10/1977 | Stehlin et al. | 357/44 |
| 4,240,846 A | * 12/1980 | Doyle | 148/175 |
| 4,357,622 A | * 11/1982 | Magdo et al. | 357/44 |
| 4,900,694 A | * 2/1990 | Nakagawa | 437/109 |
| 4,960,726 A | * 10/1990 | Lechaton et al. | 437/59 |
| 4,965,215 A | * 10/1990 | Zambrano et al. | 437/31 |
| 5,100,812 A | * 3/1992 | Yamada et al. | 437/31 |
| 5,346,838 A | * 9/1994 | Ueno | 437/7 |
| 5,648,281 A | * 7/1997 | Willims et al. | 437/33 |
| 5,866,461 A | * 2/1999 | Puzzolo et al. | 438/323 |
| 5,915,186 A | * 6/1999 | Gomi | 438/313 |
| 6,004,855 A | * 12/1999 | Pollock et al. | 438/342 |
| 6,033,947 A | * 3/2000 | Cacciola et al. | 438/202 |
| 6,071,767 A | * 6/2000 | Monkowski et al. | 438/202 |
| 6,084,284 A | * 7/2000 | Adamic, Jr. | 257/506 |
| 6,127,723 A | * 10/2000 | Aiello et al. | 257/582 |
| 6,140,694 A | * 10/2000 | Chen et al. | 257/574 |

* cited by examiner

*Primary Examiner*—Long Pham
*Assistant Examiner*—Fernando Toledo
(74) *Attorney, Agent, or Firm*—Lisa K. Jorgenson; Robert Iannucci; Seed IP Law Group PLLC

(57) ABSTRACT

An electronic power device is integrated on a substrate of semiconductor material having a first conductivity type, on which an epitaxial layer of the same type of conductivity is grown. The power device comprises a power stage PT and a control stage CT, this latter enclosed in an isolated region having a second type of conductivity type. The power stage PT comprises a first buried area having the second type of conductivity type and a second buried area, partially overlapping the first buried area and having the first conductivity type. The isolation region and the control stage CT comprise respectively a third buried area, having the second conductivity type, and a fourth buried area, partially overlapped to the third buried area and having the first conductivity type. Said first, second, third and fourth buried areas are formed in the epitaxial layers at a depth sufficient to allow the power stage PT and the control stage CT to be entirely formed in the epitaxial layers.

20 Claims, 3 Drawing Sheets

ELECTRONIC POWER DEVICE INTEGRATED ON A SEMICONDUCTOR MATERIAL AND RELATED MANUFACTURING PROCESS

TECHNICAL FIELD

This invention relates to an electronic power device integrated on a semiconductor material.

The invention further relates to a manufacturing process for an electronic power device.

BACKGROUND OF THE INVENTION

As is known, in the conventional technology used in the production of integrated power devices, for example VIPower type technology (VIPower is a trade mark of STMICROELECTRONICS S.r.l. and means vertically intelligent power) or the Smart power BCD type, the isolation between a power portion and a control portion comprised in the power device is produced by the known technique of junction isolation.

More particularly, this technology makes use of an epitaxial growth split in two distinct moments of the process sequence which leads to the production of the device.

The presence of a first epitaxial layer and of a second epitaxial layer overlapping the first is in fact useful for producing buried areas, having an opposite conductivity sign compared to that of the epitaxial layer, which will form areas of isolation including the control portions of the power devices.

This split epitaxial growth further allows the formation of buried areas having the same conductivity type as the epitaxial layer, but with different resistive values.

Although this known technical solution is advantageous as far as certain aspects thereof are concerned, it nevertheless presents certain drawbacks such as:

high production costs for the power device;

high dispersion of resistivity and thickness values (sometimes greater than 10%) and non-uniformity in growth on the slice of semiconductor material on which the device is integrated;

difficulty in alignment of the areas produced in the second epitaxial layer compared to those produced in the first epitaxial layer.

SUMMARY OF THE INVENTION

An embodiment of this invention is an electronic power device integrated in a semiconductor material, with structural and functional features able to overcome the limitations and/or drawbacks previously indicated with respect to the prior art.

The embodiment is directed to a process which allows for the production of improved electronic power devices, which in terms of electric performance and of space used, are better than the devices designed with the above mentioned known techniques.

The method produces electronic power devices without having to use the double epitaxial growth and instead uses an ion implantation at high energy.

The use of high energy ion implants does not lead to high costs in the processes of integration because the machinery used in manufacturing these is very productive, that is, the machinery is able to work a high number of slices of semiconductor material in a short time, and therefore is less expensive.

The features and the advantages of the invention will become clear from the following description of an embodiment thereof, which is herein set as example for descriptive and non limiting purposes, with reference to the attached drawings.

DETAILED DESCRIPTION

Figure 9:
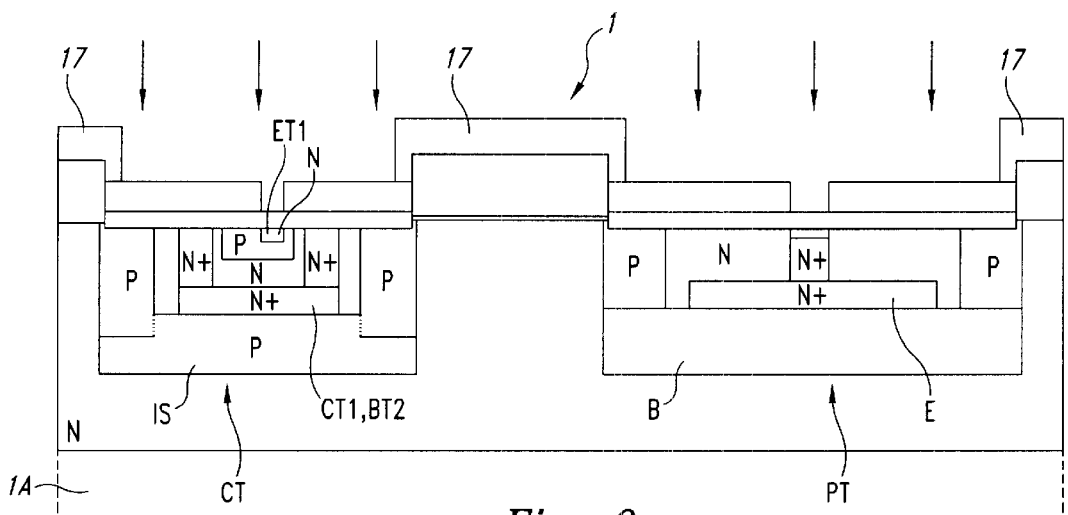

With reference to FIG. 9, an electronic power device 1 according to an embodiment of the invention comprises one power stage indicated with PT and one control stage indicated with CT.

Still referring to FIG. 9 the control stage CT includes a signal transistor T1 of NPN type and a lateral signal transistor T2 of PNP type.

For ease of exposure, the structure of device 1 will now be described with reference to the process phases of its manufacture.

Generally, for the production of the device 1 a substrate of semiconductor material 1A is used, for example silicon, having a first conductivity type, in particular N++.

Figure 1:
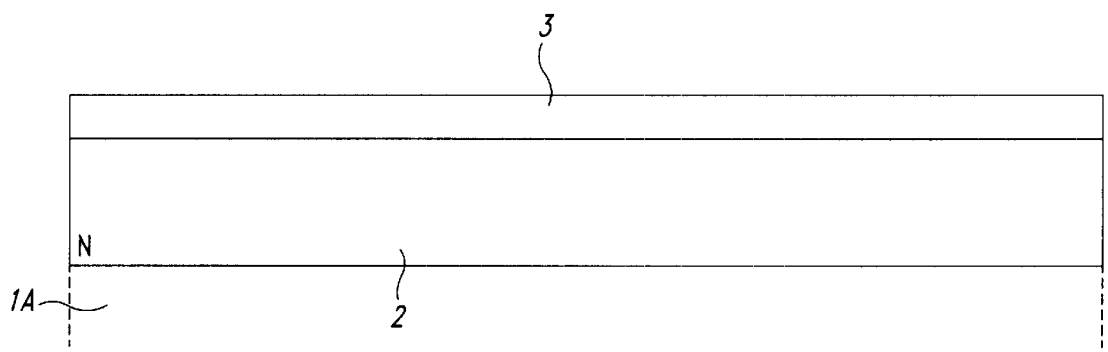
FIGS. 1 to 9 show in temporal sequence the phases of the manufacturing process of a power device according to an embodiment of the invention.

An epitaxial layer 2 is grown on the substrate 1A having the same conductivity type, in particular N (FIG. 1).

It is as well to specify that the epitaxial layer 2 presents a concentration and a thickness which are suitably calibrated according to the class of voltage to which device 1 will have to operate.

Still referring to FIG. 1, an oxide layer 3 is then formed on the epitaxial layer 2.

Figure 2:
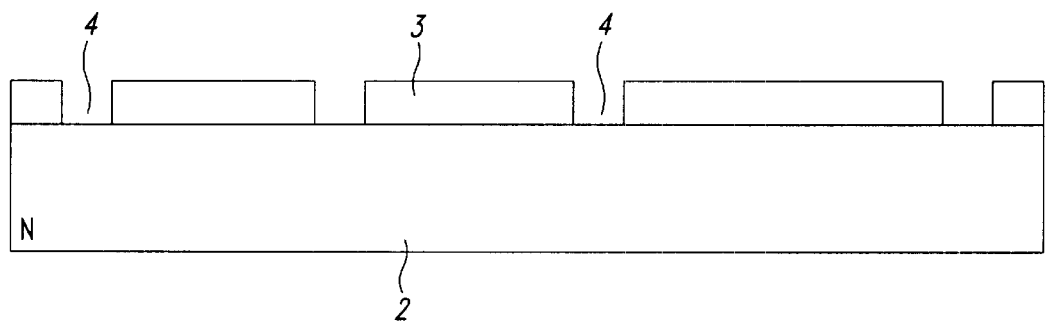
Figure 3:
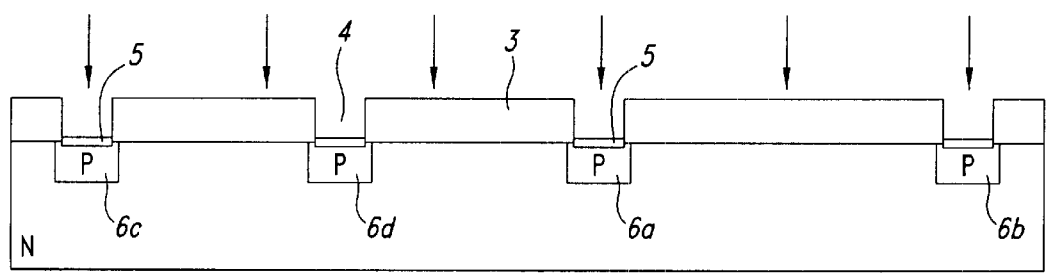

After the removal of portions 4 of the oxide layer 3 (FIG. 2) and the growth of a first pre-implant oxide layer 5 (FIG. 3) on the corresponding portions of epitaxial layer 2 left uncovered, an ion implantation follows. The ion implantation is carried out with an energy comprised between 20 and 200 KeV and following diffusion of a dopant ions having a second conductivity type, in particular P, for creating surface contact areas 6a, 6b, 6c, 6d.

More particularly, the contact areas 6a and 6b form a surface contact base region of the power stage PT, whilst the surface contact areas 6c and 6d form a portion of surface contact of an isolation region IS which surrounds the control stage CT (FIG. 9).

Figure 4:
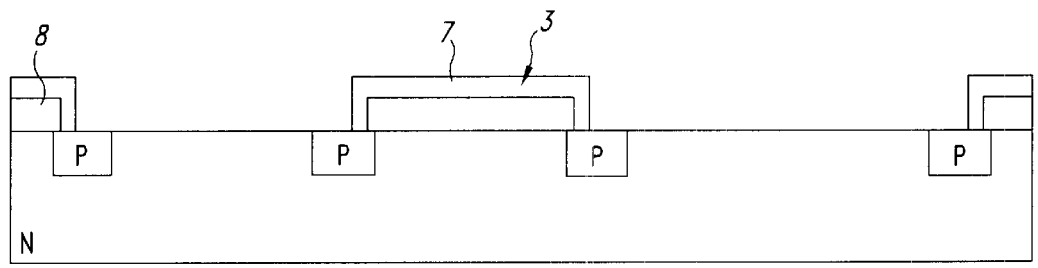

A deposition of a first thin photoresist film 7 is performed and is followed by the removal of portions of the first pre-implant oxide layer 5 and of portions of oxide layer 3 not covered by the first thin photoresist film 7 (FIG. 4).

Figure 5:
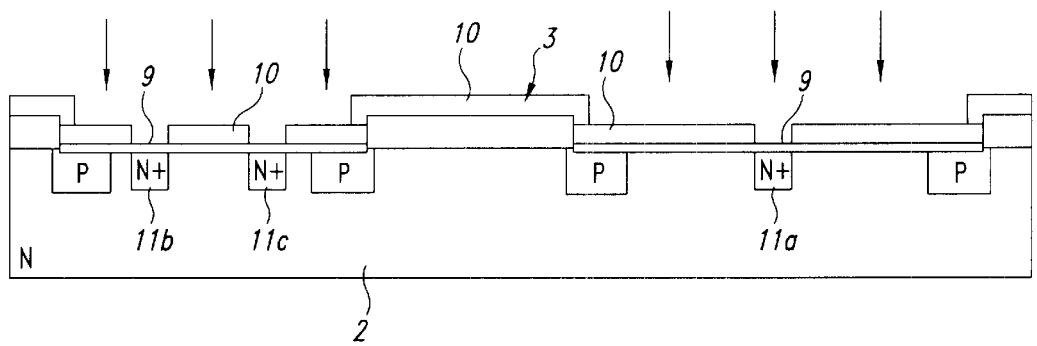

A second pre-implant oxide layer 9 is then grown (FIG. 5).

The removal of the first thin photoresist film 7 is then carried out.

Still referring to FIG. 5, the deposition of a second thin photoresist film 10 is then foreseen, followed by an ion implantation carried out at an energy comprised between 20 and 200 KeV and following diffusion of a dopant ions having a first conductivity type, in particular N+, in order to produce surface contact areas 11a, 11b, and 11c.

More particularly, the area 11a creates a surface contact emitter region of the power stage PT, whilst the 11b and 11c areas form a surface contact area including a surface contact collector region of the signal transistor T1 and an area of a surface contact base region of the lateral signal transistor T2.

Figure 6:
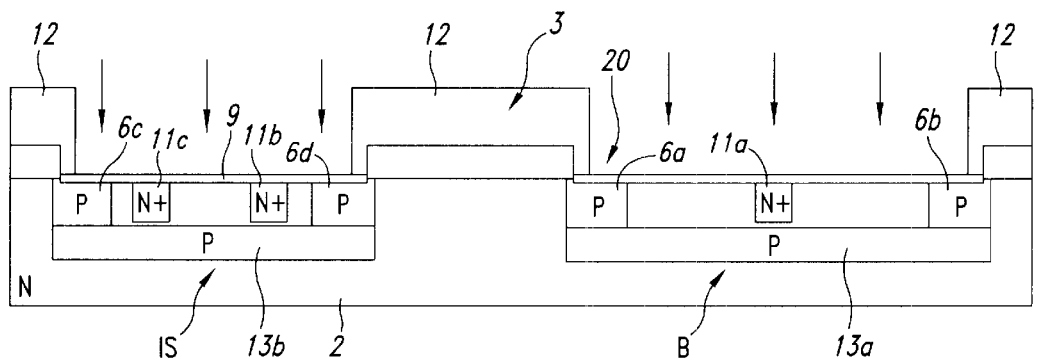

After the removal of the second thin photoresist film 10, the deposition of a first thick photoresist film 12 having a thickness of about 6 μm is carried out, followed by an ion implantation at high energy greater than 3000 KeV and in doses of round $10^{13}$–$10^{14}$ ion/cm2 and by a following diffusion of a dopant ions having a second type of conductivity type, in particular P, in the portions of epitaxial layer 2 not protected by the thick photoresist film 12, to form buried areas 13a and 13b at a depth of about 6 μm from an upper surface 20 of the epitaxial layer 2 (FIG. 6).

More particularly, still referring to FIG. 6, the buried area 13a adjoining the surface contact base region completes a base region B of the power stage PT, having a preferably annular form as seen from the upper surface 20 of the device 1.

Furthermore, the buried area 13b adjoining the portion of surface contact completes the isolation region IS and also preferably has an annular form.

Figure 7:
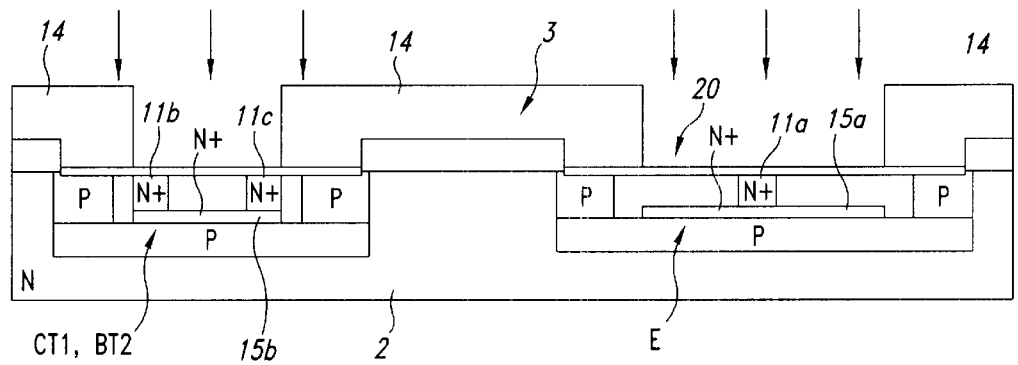

After the removal of the first thick photoresist film 12, the deposition of a second thick photoresist film 14 then follows, with a thickness of 6 μm, followed by a further ion implantation of high energy greater than 3000 KeV and in doses of around $10^{14}$–$10^{15}$ ions/cm$^2$ and by a following diffusion of a dopant ions having a first conductivity type, in particular N+, in the portions of epitaxial layer 2 not protected by the second thick photoresist film 14, for the formation of buried areas 15a and 15b at low resistivity and at a depth of around 3–4 μm from the surface 20 (FIG. 7).

The buried areas 15a and 15b lay in part above respectively the buried areas 13a and 13b.

More particularly, the buried area 15a adjoining the emitter surface region 11a forms an emitter region E, preferably of annular form, of the power stage PT, while the buried area 15b adjoining the surface contact area (11a, 11b) forms an area (CT1, BT2), also preferably of annular form, including a collector region CT1 of the signal transistor T1 and an extrinsic base region BT2 of the lateral signal transistor T2.

The annular emitter region E is enclosed in the annular base region B, whilst the annular area (CT1, BT2) is enclosed in the isolation region IS.

Figure 8:
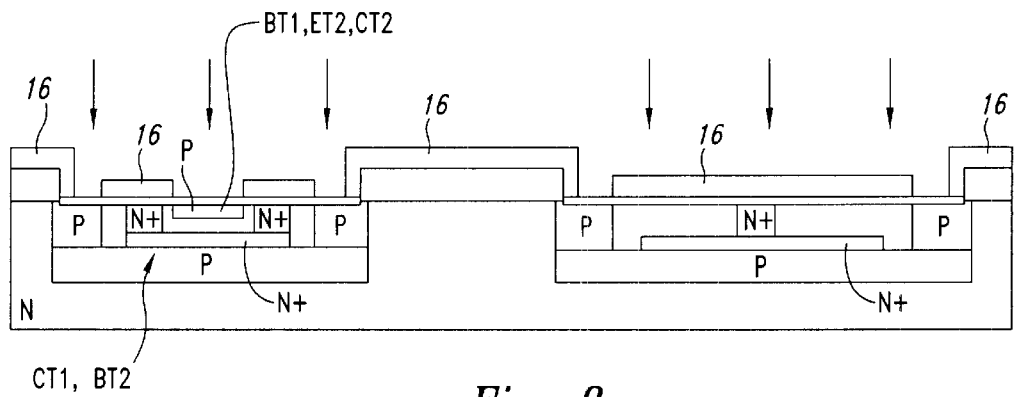

Subsequently, after the removal of the second thick photoresist film 14 and the deposition of a third thin photoresist film 16, an ion implantation is carried out with an energy comprised between 20 and 200 KeV and with a following diffusion of a dopant ions having a second conductivity type, in particular P, in the portions of epitaxial layer 2 not protected by the third thin photoresist film 16, to form an area (BT1, ET2, CT2), enclosed in the annular area (CT1, BT2), and including a base region BT1 of the signal transistor T1 and emitter ET2 and collector CT2 regions of the lateral signal transistor T2 (FIG. 8).

After the removal of the third thin photoresist film 16 and the deposition of a fourth thin photoresist film 17, a further ion implantation is carried out with energy comprised between 20 and 200 KeV and with a following diffusion of a dopant ions having a first conductivity type, in particular N, in the portions of epitaxial layer 2 not protected by the thin photoresist film 17, to form an emitter region ET1 of the signal transistor T1 (FIG. 9).

Finally, on the front surface of device 1 which is covered by a silicon dioxide layer with known photolithographic techniques of deposition, metal strips are formed which when in contact with the surface areas form the electrodes of the device itself.

In conclusion, the electronic power device 1, not needing a double epitaxial layer in order to be produced, leads to the elimination of all the drawbacks connected to the presence of this double layer (non-uniformity of thickness and resistivity in and between the slices of semiconductor material, difficulty in aligning the areas produced in the upper epitaxial layer as compared to those in the lower epitaxial layer).

Furthermore, the process for the production of the device 1, is therefore carried out in an extremely shorter working time, in that the use of ion implants at high energy allow for drastically reduced diffusion times.

The above cited process further allows for electronic power devices with electrically active crystallographic defect density which is practically negligible compared to that one obtained by using the known technique described above.

This improvement is actually due to the use of ion implantation at high energy which as is known causes damage (in any case totally recoverable) to the crystal only in the areas where the doping ion stops, whilst leaving the surface of the slice undamaged. Further, the process allows for the realization of electronic power devices with vertical and horizontal dimensions which are extremely reduced (for example a vertical control NPN transistor with the relative isolation area is produced in 5 μm thickness and has an overall dimension of ~4×4 μm$^2$ of active emitter area).

Finally, the process according to the invention allows for, in equal applications, electrical components having better features than those offered by prior art components (for example: transition frequency in the $10^9$–$10^{10}$ Hz field for control transistors of the NPN type, vertical power transistors of the NPN type with higher commutating speeds and/or with larger SOA (Safe Operating Areas).

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A process for the manufacturing of an electronic power device integrated on a substrate of semiconductor material having a first conductivity type, on which an epitaxial layer has grown, of the first conductivity type, said power device including a power stage PT and a control stage CT, the latter enclosed in an isolation region having a second conductivity type, said portion of power PT including a first buried area, having the second conductivity type, and a second buried area, partially overlapping the first buried area and having the first conductivity type, said isolation region and said control stage CT comprising respectively a third buried area, having the second conductivity type, and a fourth buried area, partially overlapping the third buried area and having the first conductivity type, the method comprising:

depositing a first thick photoresist film on a portion the epitaxial layer and leaving portions of the epitaxial layer unprotected by the first thick photoresist film;

implanting at high energy first dopant ions having the second conductivity type in the portions of epitaxial layer not protected by the first thick photoresist film, for forming the first and third buried areas;

removing the first thick photoresist film and depositing on a portion of the epitaxial layer a second thick photoresist film and leaving portions of the epitaxial layer unprotected by the second thick photoresist film;

implanting at high energy second dopant ions having the first conductivity type in the portions of epitaxial layer not protected by the second thick photoresist film, for forming the second and fourth buried areas, wherein each of the buried areas is buried within the epitaxial layer such that each buried layer is completely covered by the epitaxial layer;

removing the second thick photoresist film; and totally forming the power stage PT and the control stage CT in the epitaxial layer.

2. The process according to claim 1, wherein the implantation acts are carried out with an energy greater than 3000 KeV.

3. The process according to claim 1, wherein the first dopant ions are implanted in doses of around $10^{13}$–$10^{14}$ ions/cm$^2$.

4. The process according to claim 1, wherein the second dopant ions are implanted in doses of around $10^{14}$–$10^{15}$ ions/cm$^2$.

5. The process according to claim 1, wherein the first and the second thick photoresist films each have a thickness of about 6 μm.

6. A method of manufacturing an electronic power device integrated on a semiconductor substrate, the method comprising:

growing an epitaxial layer of a first conductivity type on the substrate;

forming a first thick photoresist film on the epitaxial layer, the first thick photoresist leaving portions of the epitaxial layer unprotected;

implanting at high energy first dopant ions of a second conductivity type in the portions of the epitaxial layer unprotected by the first thick photoresist film to thereby form first and second buried areas;

removing the first thick photoresist film;

forming a second thick photoresist film on the epitaxial layer, the second thick photoresist leaving portions of the epitaxial layer unprotected; and implanting at high energy second dopant ions of the first conductivity type in the portions of the epitaxial layer unprotected by the second thick photoresist film to thereby form third and fourth buried areas in the first and second buried areas, respectively, wherein each of the buried areas is completely covered by portions of the epitaxial layer.

7. The method of claim 6, further comprising forming a first control transistor in the first buried area and forming a first power transistor in the second buried area.

8. The method of claim 6 wherein the implanting acts are carried out at energy levels greater than 3000 KeV.

9. The method of claim 6 wherein the first dopant ions are implanted in doses of around $10^{13}$–$10^{14}$ ions/cm$^2$.

10. The method of claim 6 wherein the second dopant ions are implanted in doses of around $10^{14}$–$10^{15}$ ions/cm$^2$.

11. The method of claim 6 wherein the first and the second thick photoresist films each have a thickness of about 6 μm.

12. A process for the manufacturing of an electronic power device integrated on a substrate of semiconductor material having a first conductivity type, on which an epitaxial layer has grown, of the first conductivity type, said power device including a power stage PT and a control stage CT, the latter enclosed in an isolation region having a second conductivity type, said portion of power PT including a first buried area, having the second conductivity type, and a second buried area, partially overlapping the first buried area and having the first conductivity type, said isolation region and said control stage CT comprising respectively a third buried area, having the second conductivity type, and a fourth buried area, partially overlapping the third buried area and having the first conductivity type, the method comprising:

depositing a first thick photoresist film on a portion the epitaxial layer and leaving portions of the epitaxial layer unprotected by the first thick photoresist film;

implanting at high energy first dopant ions having the second conductivity type in the portions of epitaxial layer not protected by the first thick photoresist film, for forming the first and third buried areas;

removing the first thick photoresist film and depositing on a portion of the epitaxial layer a second thick photoresist film and leaving portions of the epitaxial layer unprotected by the second thick photoresist film;

implanting at high energy second dopant ions having the first conductivity type in the portions of epitaxial layer not protected by the second thick photoresist film, for forming the second and fourth buried areas;

removing the second thick photoresist film;

totally forming the power stage PT and the control stage CT in the epitaxial layer; and forming first, second, third, and fourth contact regions in the epitaxial layer, the first and second contact regions extending from a surface of the epitaxial layer to contact opposite ends of the first buried area, and the third and fourth contact regions extending from the surface of the epitaxial layer to contact opposite ends of the third buried area.

13. The process according to claim 12 wherein the contact regions are formed by:

forming an oxide layer directly on the epitaxial layer;

etching first, second, third, and fourth apertures in the oxide layer, thereby exposing first, second, third, and fourth exposed regions of the epitaxial layer; and implanting dopant ions through the apertures of the oxide layer and into the exposed regions of the epitaxial layer, thereby forming the contact regions.

14. The process according to claim 12 wherein the second buried area is formed between the first and second contact regions and the fourth buried area is formed between the third and fourth contact regions.

15. A process for the manufacturing of an electronic power device integrated on a substrate of semiconductor material having a first conductivity type, on which an epitaxial layer has grown, of the first conductivity type, said power device including a power stage PT and a control stage CT, the latter enclosed in an isolation region having a second conductivity type, said portion of power PT including a first buried area, having the second conductivity type, and a second buried area, partially overlapping the first buried area and having the first conductivity type, said isolation region and said control stage CT comprising respectively a third buried area, having the second conductivity type, and a fourth buried area, partially overlapping the third buried area and having the first conductivity type, the method comprising:

depositing a first thick photoresist film on a portion the epitaxial layer and leaving portions of the epitaxial layer unprotected by the first thick photoresist film;

implanting at high energy first dopant ions having the second conductivity type in the portions of epitaxial layer not protected by the first thick photoresist film, for forming the first and third buried areas;

removing the first thick photoresist film and depositing on a portion of the epitaxial layer a second thick photoresist film and leaving portions of the epitaxial layer unprotected by the second thick photoresist film;

implanting at high energy second dopant ions having the first conductivity type in the portions of epitaxial layer not protected by the second thick photoresist film, for forming the second and fourth buried areas;

removing the second thick photoresist film;

totally forming the power stage PT and the control stage CT in the epitaxial layer;

forming an oxide layer directly on the epitaxial layer;

depositing on the oxide layer a thin photoresist film having apertures above the portions of the epitaxial layer in which the first and third buried areas will be formed; and etching away portions of the oxide layer exposed by the apertures of the thin photoresist film, thereby leaving portions of the oxide layer protected by the thin photoresist film; and removing the thin photoresist film before depositing the first thick photoresist film on the portions of the oxide layer that were protected by the thin photoresist film.

16. A process for the manufacturing of an electronic power device integrated on a substrate of semiconductor material having a first conductivity type, on which an epitaxial layer has grown, of the first conductivity type, said power device including a power stage PT and a control stage CT, the latter enclosed in an isolation region having a second conductivity type, said portion of power PT including a first buried area, having the second conductivity type, and a second buried area, partially overlapping the first buried area and having the first conductivity type, said isolation region and said control stage CT comprising respectively a third buried area, having the second conductivity type, and a fourth buried area, partially overlapping the third buried area and having the first conductivity type, the method comprising:

depositing a first thick photoresist film on a portion the epitaxial layer and leaving portions of the epitaxial layer unprotected by the first thick photoresist film;

implanting at high energy first dopant ions having the second conductivity type in the portions of epitaxial layer not protected by the first thick photoresist film, for forming the first and third buried areas;

removing the first thick photoresist film and depositing on a portion of the epitaxial layer a second thick photoresist film and leaving portions of the epitaxial layer unprotected by the second thick photoresist film;

implanting at high energy second dopant ions having the first conductivity type in the portions of epitaxial layer not protected by the second thick photoresist film, for forming the second and fourth buried areas;

removing the second thick photoresist film; and totally forming the power stage PT and the control stage CT in the epitaxial layer, wherein forming the power stage PT includes:

forming in the epitaxial layer a surface contact region of the first conductivity type, wherein the second buried area is formed below and in contact with the surface contact region, thereby forming a vertical transistor in which the surface contact region and second buried area together form an emitter, the first buried area forms a base, and the epitaxial layer forms a collector.

17. A process for the manufacturing of an electronic power device integrated on a substrate of semiconductor material having a first conductivity type, on which an epitaxial layer has grown, of the first conductivity type, said power device including a power stage PT and a control stage CT, the latter enclosed in an isolation region having a second conductivity type, said portion of power PT including a first buried area, having the second conductivity type, and a second buried area, partially overlapping the first buried area and having the first conductivity type, said isolation region and said control stage CT comprising respectively a third buried area, having the second conductivity type, and a fourth buried area, partially overlapping the third buried area and having the first conductivity type, the method comprising:

depositing a first thick photoresist film on a portion the epitaxial layer and leaving portions of the epitaxial layer unprotected by the first thick photoresist film;

implanting at high energy first dopant ions having the second conductivity type in the portions of epitaxial layer not protected by the first thick photoresist film, for forming the first and third buried areas;

removing the first thick photoresist film and depositing on a portion of the epitaxial layer a second thick photoresist film and leaving portions of the epitaxial layer unprotected by the second thick photoresist film;

implanting at high energy second dopant ions having the first conductivity type in the portions of epitaxial layer not protected by the second thick photoresist film, for forming the second and fourth buried areas;

removing the second thick photoresist film; and totally forming the power stage PT and the control stage CT in the epitaxial layer, wherein forming the control stage CT includes:

forming in the epitaxial layer first and second surface contact regions of the first conductivity type;

forming a thin photoresist layer after removing the second thick photoresist layer, the thin photoresist layer covering the first and second contact regions and having an aperture that exposes a portion of the epitaxial layer between the first and second contact regions; and forming a third contact region in the portion of the epitaxial layer exposed by the aperture of the thin photoresist layer.

18. A method of manufacturing an electronic power device integrated on a semiconductor substrate, the method comprising:

growing an epitaxial layer of a first conductivity type on the substrate;

forming a first thick photoresist film on the epitaxial layer, the first thick photoresist leaving portions of the epitaxial layer unprotected;

implanting at high energy first dopant ions of a second conductivity type in the portions of the epitaxial layer unprotected by the first thick photoresist film to thereby form first and second buried areas;

removing the first thick photoresist film;

forming a second thick photoresist film on the epitaxial layer, the second thick photoresist leaving portions of the epitaxial layer unprotected;

implanting at high energy second dopant ions of the first conductivity type in the portions of the epitaxial layer unprotected by the second thick photoresist film to thereby form third and fourth buried areas in the first and second buried areas, respectively; and forming first, second, third, and fourth contact regions in the epitaxial layer, the first and second contact regions extending from a surface of the epitaxial layer to contact opposite ends of the first buried layer, and the third and fourth contact regions extending from the surface of the epitaxial layer to contact opposite ends of the second buried layer.

19. The process according to claim 18 wherein the third buried layer is formed between the first and second contact regions and the fourth buried layer is formed between the third and fourth contact regions.

20. A method of manufacturing an electronic power device integrated on a semiconductor substrate, the method comprising:

growing an epitaxial layer of a first conductivity type on the substrate;

forming a first thick photoresist film on the epitaxial layer, the first thick photoresist leaving portions of the epitaxial layer unprotected;

implanting at high energy first dopant ions of a second conductivity type in the portions of the epitaxial layer unprotected by the first thick photoresist film to thereby form first and second buried areas;

removing the first thick photoresist film;

forming a second thick photoresist film on the epitaxial layer, the second thick photoresist leaving portions of the epitaxial layer unprotected;

implanting at high energy second dopant ions of the first conductivity type in the portions of the epitaxial layer unprotected by the second thick photoresist film to thereby form third and fourth buried areas in the first and second buried areas, respectively;

forming an oxide layer directly on the epitaxial layer;

depositing on the oxide layer a thin photoresist film having apertures above the portions of the epitaxial layer in which the first and third buried layers will be formed; and etching away portions of the oxide layer exposed by the apertures of the thin photoresist film, thereby leaving portions of the oxide layer protected by the thin photoresist film; and removing the thin photoresist film before depositing the first thick photoresist film on the portions of the oxide layer that were protected by the thin photoresist film.

* * * * *